US005191217A

United States Patent [19]

Kane et al.

[11] Patent Number: 5,191,217

[45] Date of Patent: Mar. 2, 1993

[54] METHOD AND APPARATUS FOR FIELD EMISSION DEVICE ELECTROSTATIC ELECTRON BEAM FOCUSSING

[75] Inventors: Robert C. Kane, Woodstock; Norman W. Parker, Wheaton, both of Ill.

[73] Assignee: Motorola, Inc., Schaumburg, Ill.

[21] Appl. No.: 796,980

[22] Filed: Nov. 25, 1991

[51] Int. Cl.[5] .......... H01J 37/26

[52] U.S. Cl. .......... 250/423 F; 250/423 R; 313/308; 313/309; 313/336; 313/351; 315/169.1

[58] Field of Search .......... 250/423 F, 423 D; 315/169.1; 313/308, 309, 336, 351, 439

[56] References Cited

U.S. PATENT DOCUMENTS 4,145,635 3/1979 Tuck .......... 313/309
4,663,559 5/1987 Christensen .......... 313/336
4,740,705 4/1988 Crewe .......... 250/423 F
5,012,153 4/1991 Atkinson et al. .......... 313/309
5,030,895 7/1991 Gray .......... 313/309
5,064,396 11/1991 Spindt .......... 313/336

*Primary Examiner*—Jack I. Berman
*Assistant Examiner*—Kiet T. Nguyen
*Attorney, Agent, or Firm*—Eugene A. Parsons

[57] ABSTRACT

A FED with integrally formed deflection electrode coupled to the electron emitter such that any variation of electron emitter operating voltage is coincidentally impressed on the deflection electrode so as to effectively minimize variations in the emitted electron beam cross-section. In image display devices including FEDs with voltage variations induced at the electron emitter to provide image information, integrally formed deflection electrodes are connected to follow the electron emitter variations so that pixel cross-sections remain substantially invariant under device operation.

15 Claims, 8 Drawing Sheets

METHOD AND APPARATUS FOR FIELD EMISSION DEVICE ELECTROSTATIC ELECTRON BEAM FOCUSSING

FIELD OF THE INVENTION

The present invention relates generally to cold-cathode field emission devices and more particularly to a method for realizing preferred operation of a field emission device employing a deflection electrode which forms an integral part of the field emission device.

BACKGROUND OF THE INVENTION

Field emission devices (FEDs) are known in the art and are commonly employed for a broad range of applications including image display devices. In some particular applications it is desirable to control the electron beam cross-section to not more than a prescribed diameter or cross-sectional area. One technique which may be employed to effect control of emitted electron beam cross-section is incorporation of a deflection electrode as part of the FED. Some deflection electrode techniques, including those of co-pending applications filed of even date herewith, assigned to the same assignee, and entitled "Deflection Anode for Field Emission Device" and "A Field Emission Device with Integrally Formed Electrostatic Lens" provide for modification of the trajectory of the aggregate emitted electron current.

Prior art field emission devices which employ deflection electrode elements typically are modulated by variations in voltages applied to an extraction electrode. The electron beam cross-section of this method is found to exhibit only a low sensitivity to variation in the extraction electrode voltages. However, the modulation technique is not preferred.

It is now known by the inventors that some performance benefit may be derived by operating a field emission image device in a different mode wherein the extraction electrode voltage is not employed as the modulating means; but only as a switching means. In this particular mode of operation, as described in U.S. Pat. No. 5,138,237, entitled "A Field Emission Electron Device Employing a Modulatable Diamond Semiconductor Emitter", filed Aug. 20, 1991, with Ser. No. 07/747,564 and assigned to the same assignee, a modulating voltage which determines a required electron emission current is operably applied to the electron emitter electrode to provide image intelligence such as, for example, a variation in image brightness. Although this method provides advantage for device operation it proves to be disadvantageous with respect to desired electron beam cross-section stability since electron beam cross-section is strongly dependent on the voltage difference between the deflection electrode and the electron emitter.

Accordingly, there is a need for a field emission device employing a deflection electrode and/or a method for forming a field emission device with an integral deflection electrode which overcomes at least some of these shortcomings.

SUMMARY OF THE INVENTION

This need and others are substantially met through provision of a field emission device including an electron emitter for emitting electrons, an extraction electrode for inducing electron emission from the electron emitter, a deflection electrode for modifying emitted electron trajectories, and an anode for collecting emitted electrons, the electron emitter, extraction electrode, deflection electrode, and anode being designed to have a plurality of electrical sources coupled thereto in a manner which provides for a fixed voltage relationship between the deflection electrode and electron emitter and for electrons emitted by the electron emitter and collected by the anode to form an electron beam with a predetermined cross-section.

This need and others are further met through provision of the field emission device described above wherein one of the electron emitter and extraction electrode are designed to have a signal source coupled thereto for modulating electron emission in the field emission device, such that variation of the signal source to effect modulation of the electron emission does not substantially change the electron beam cross-section.

DETAILED DESCRIPTION OF THE PREFERRED EMBODIMENTS

Figure 1:
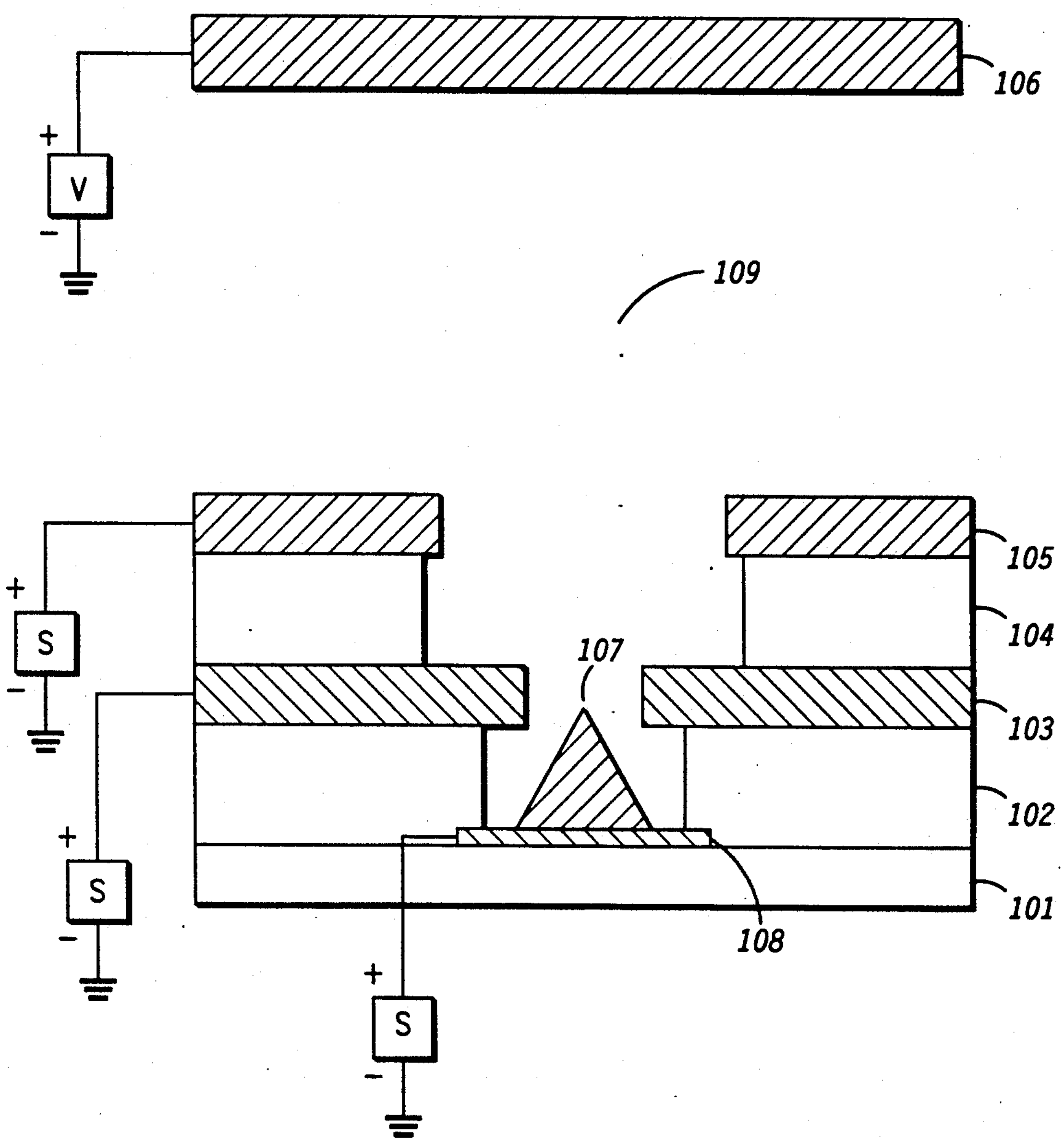
FIG. 1 is a side elevational cross-sectional depiction of a field emission device incorporating a deflection electrode as part of the FED.

Referring now to FIG. 1 there is depicted a side elevational cross-sectional representation of a field emission device (FED), constructed in accordance with a co-pending application filed of even date herewith, (Ser. No. 07/800,810, filed Nov. 29, 1991) assigned to the same assignee, and entitled "A Field Emission Device with Integrally Formed Electrostatic Lens", which application is incorporated herein by reference. A supporting substrate 101 is provided whereon a selectively patterned first conductive/semiconductive layer 108 is disposed. A first insulator layer 102 is disposed on supporting substrate 101 and conductive layer 108. A second conductive/semiconductive layer 103, which functions as an FED extraction electrode, is disposed on first insulator layer 102. A second insulator layer 104 is shown disposed on conductive/semiconductive layer 103. A third conductive/semiconductive layer 105, which functions as an FED deflection electrode, is disposed on insulator layer 104. An anode electrode 106 is distally disposed with respect to an electron emitter electrode 107 which is disposed on conductive/semiconductive layer 108.

As depicted in FIG. 1, the FED has suitable externally provided voltage sources coupled to the various electrodes of the device to produce a desired operation, to be described presently. FIG. 1 serves to illustrate the dispositional relationship between the various FED electrodes and to define a region 109 which exists proximal to electron emitter 107 and substantially between electron emitter 107 and anode 106. Consideration of FED electrodes exclusive of supporting structure and intervening insulator layers provides for the deflection electrode (layer 105) to be functionally disposed in region 109 and for computer model analysis as will be subsequently described.

Figure 2:
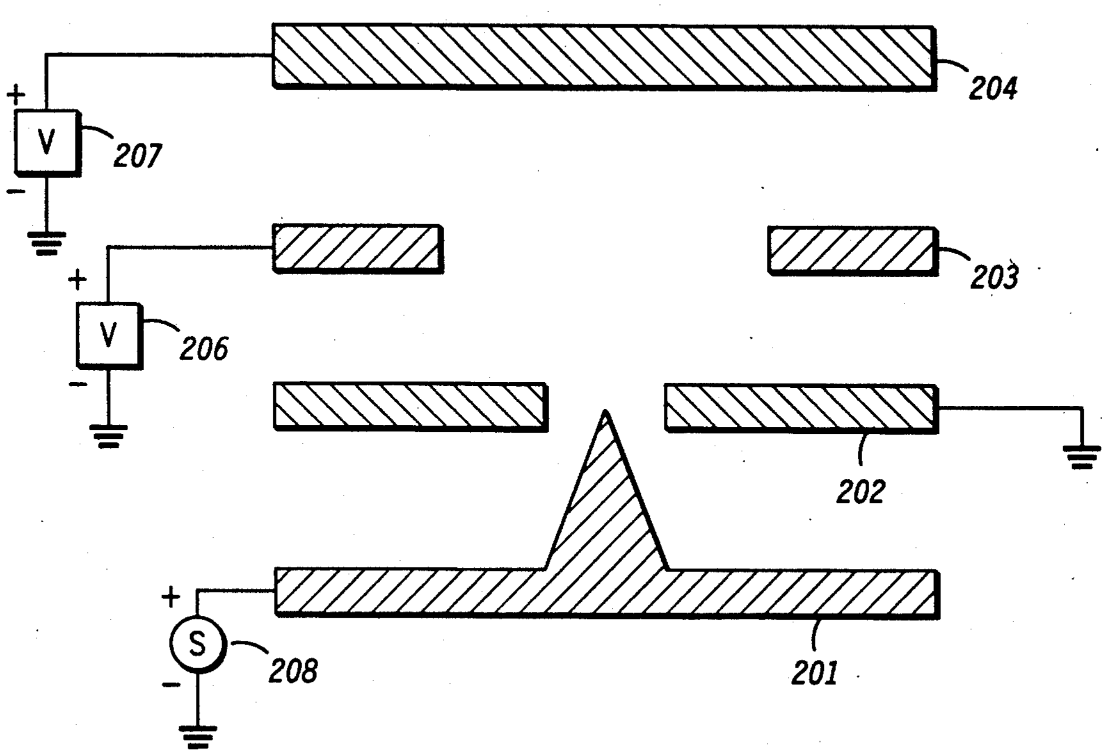
FIG. 2 is a schematical representation of a method of operating FEDs incorporating a deflection electrode as part of the FED.

FIG. 2 is a schematical representation of an FED wherein an electron emitter 201 is coupled to an externally provided signal source 208, an extraction electrode 202 is coupled to an externally provided reference potential, a deflection electrode 203 is coupled to a second externally provide voltage source 206, and an anode 204 is connected to a third externally provided voltage source 207. This embodiment of a FED circuit, in accordance with the above referenced co-pending application, effects emitted electron modulation by varying the voltage provided to electron emitter 201. As the voltage applied to electron emitter 201 is varied to modulate the FED electron emission the electron beam cross-section is coincidentally affected as will be illustrated.

Figure 3A:
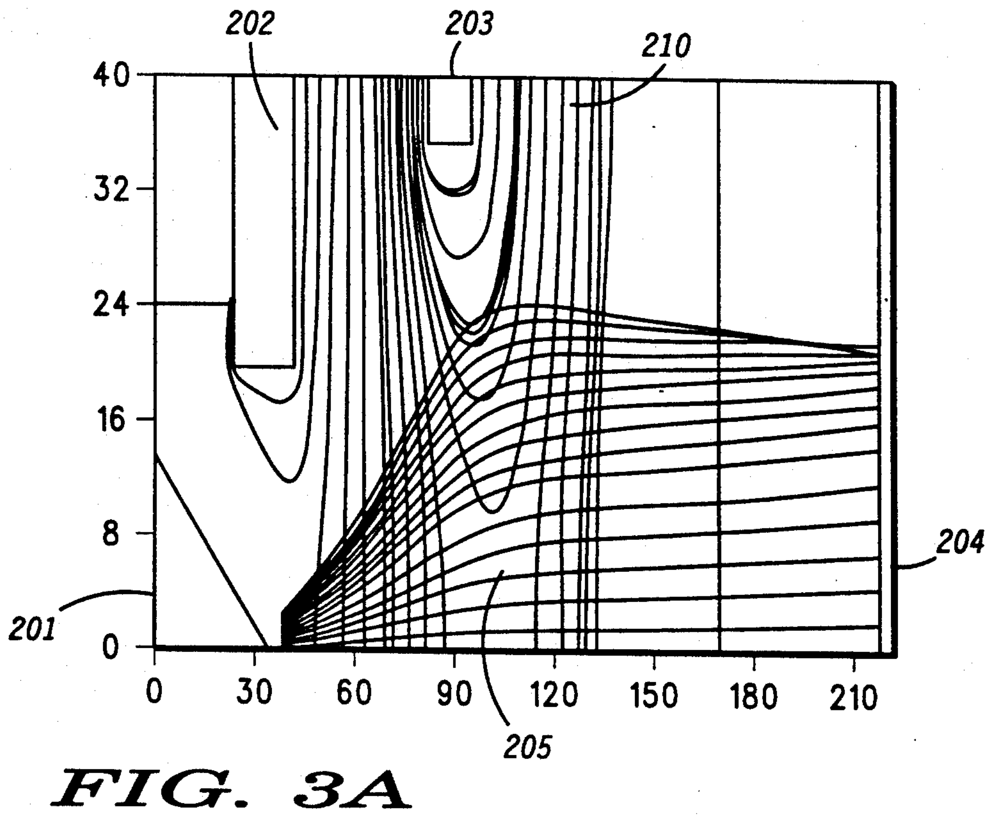
FIGS. 3A–3C are graphical computer model representations of the field emission device of FIG. 2 depicting emitted electron trajectories.

Referring now to FIG. 3A there is shown a graphical computer model representation of the FED and externally provided electrical sources illustrated in FIG. 2, including electron emitter 201, extraction electrode 202, deflection electrode 203, anode 204, and further depicting emitted electron transit trajectories (electron beam) 205 and equipotential lines 210. The depiction exhibits an upper one-half section of a cylindrically symmetrical device wherein the lower one-half representation (not depicted) is a mirror reproduction of the depicted upper one-half. Equipotential lines 210 are representative of an electric field which exists in the region, described earlier with reference to FIG. 1, between anode 204 and electron emitter 201 when an externally provided voltage source is operably coupled to anode 204. Electrons, which are emitted from electron emitter 201 by virtue of a suitable externally provided voltage operably coupled to the extraction electrode 202, are accelerated through the electric field in the region and preferentially collected at anode 204. Alternatively, a suitable potential may be provided at electron emitter 201 to achieve electron emission, since it is the voltage relationship between electron emitter 201 and extraction electrode 202 which governs emission.

The computer model representation of FIG. 3A further indicates that electron beam 205 is modified by the presence of deflection electrode 203, to which a suitable externally provided voltage source 206 is connected. In the instance of the device of FIG. 3A the voltage applied to deflection electrode 203 is preferentially selected so as to provide a desired modification to the cross-section of electron beam 205 to yield a substantially collimated/focussed electron beam 205 with a predetermined cross-section. For the computer model representation now under consideration, voltages operably coupled to the device electrodes include; 0.0 volts electron emitter voltage, 50.0 volts extraction electrode voltage, 0.0 volts deflection electrode voltage, and 8.3 volts anode voltage. Other embodiments achieving similar modification to the emitted electron trajectories may be realized by disposing deflection electrode 203 more/less distally with respect to electron emitter 201 and correspondingly changing the voltage operably coupled thereto. For the structure depicted in FIG. 3A and in subsequent computer model depictions provided herein, dimensions are shown in units of 0.02 micrometers per unit.

Figure 3B:
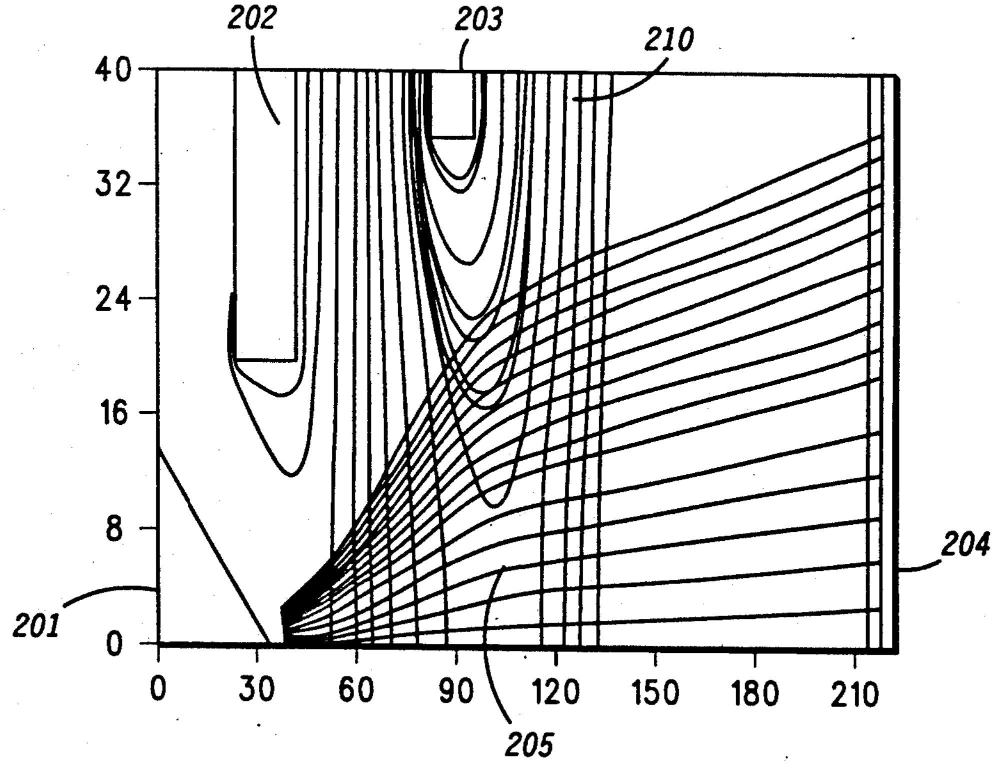

FIG. 3B is another graphical computer model representation of the FED described previously with reference to FIG. 2. It may be observed that in this representation the voltage applied to electron emitter 201 has been changed in a manner consistent with known modulation techniques. That is, a functional application of an FED is to provide for emitted electron modulation by varying the voltage applied to electron emitter 201. However, in so doing the modification of electron beam 205 induced by the voltage applied to deflection electrode 203 is disadvantageously affected. As is clearly illustrated in FIG. 3B, decreasing the voltage applied to electron emitter 201, in an effort to increase the electron emission, has resulted in a broadening of the cross section of electron beam 205. In the instance of the representation of FIG. 3B the voltage applied to electron emitter 201 has been changed to −5.0 volts.

Figure 3C:
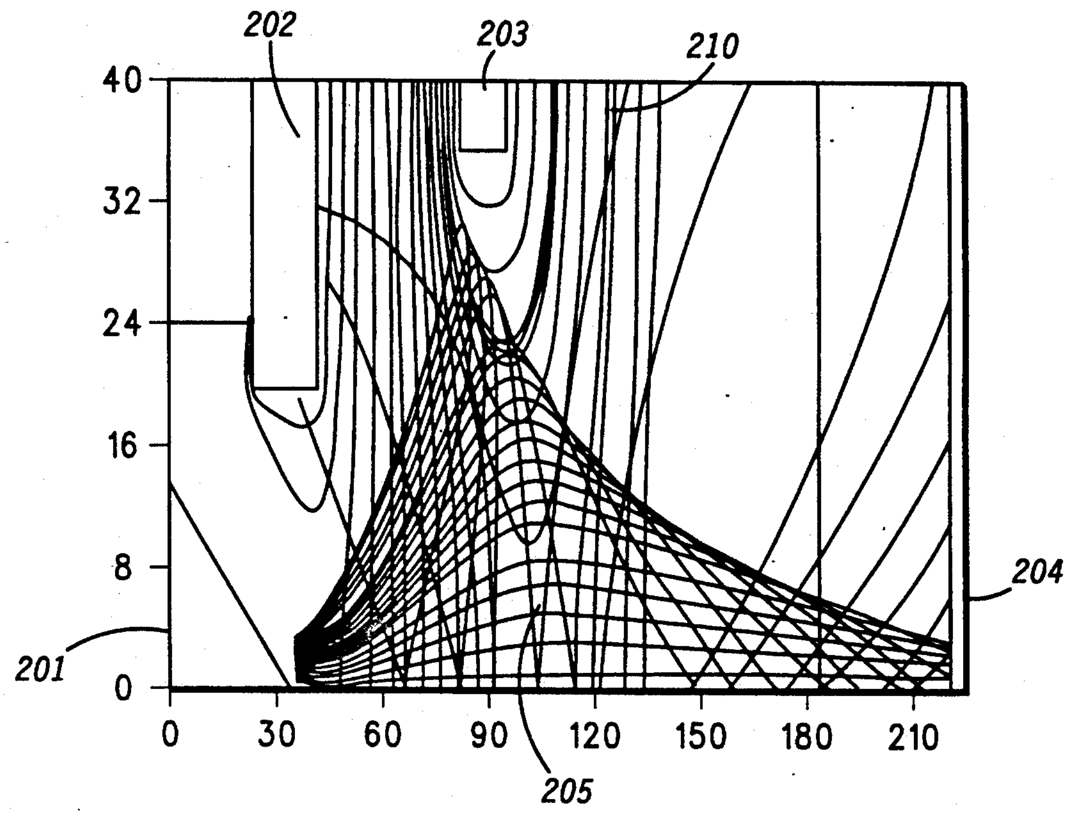

FIG. 3C is another graphical computer model representation of the FED described previously with reference to FIG. 2 wherein the voltage applied to electron emitter 201 has been increased in an effort to reduce the electron emission. In so doing it is observed that the modification of electron beam 205 induced by the voltage applied to deflection electrode 203 is disadvantageously affected. As may be observed from FIG. 3C, increasing the voltage applied to electron emitter 201 in an attempt to reduce electron emission results in an over-focusing of electron beam 205. This over-focusing is clearly illustrated as the computer model representation shows electron trajectories emerging into the depicted upper one-half which have originated in the lower one-half (not depicted) of the structure. It is expected that the emergence point of electron trajectories into the upper one-half depicted will coincide with electron trajectories entering into the lower one-half (not depicted) and is verified in FIG. 3C. In the instance of the representation of FIG. 3C, the voltage applied to electron emitter 201 has been changed to 5.0 volts.

The FED operational characteristics illustrated in FIGS. 3A–3C are commonly realized by the technique wherein the modulation of electron emission is accomplished by variation of the electron emitter voltage.

Figure 4A:
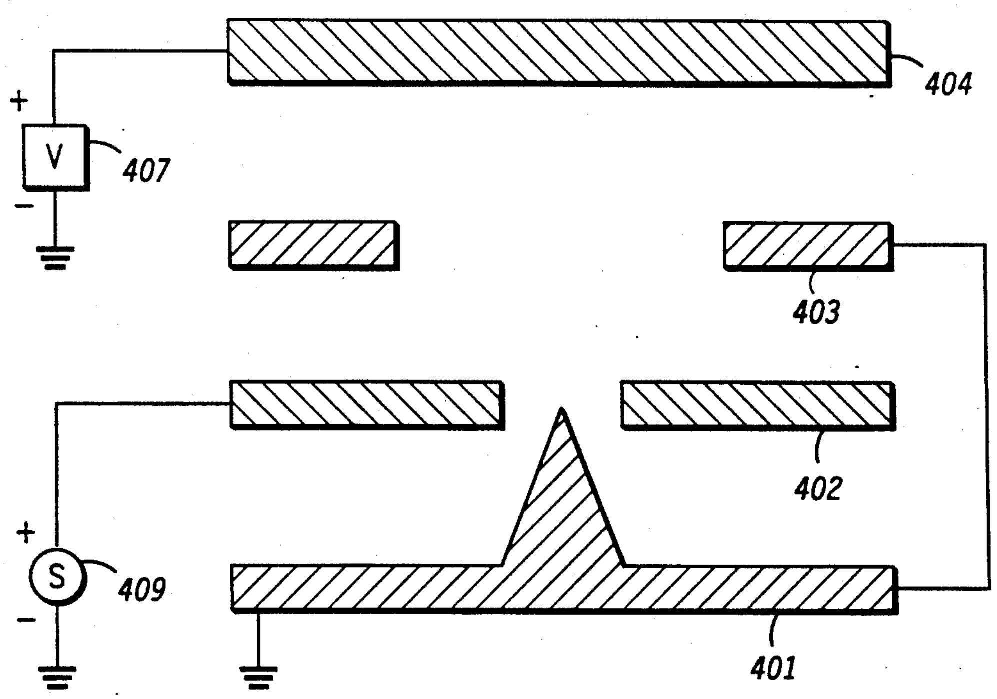
FIGS. 4A and 4B are schematical representations of embodiments of methods of operating FEDS in accordance with the present invention.

Referring now to FIG. 4A, there is shown a schematical representation of an FED in accordance with the present invention and wherein reference designators corresponding to features first described with reference to FIG. 2 are similarly referenced beginning with the numeral "4". In the depiction of FIG. 4A, an externally provided signal source 409 is coupled to an extraction electrode 402 to provide modulation of the electron emission. An externally provided electrical source 407 is connected to an anode 404 for the preferential collection of the emitted electrons, which electrons are formed into a beam (not shown) of a predetermined cross-section by the cooperation of the various components. A deflection electrode 403 is coupled to an electron emitter 401 in this embodiment. Connecting deflection electrode 403 to electron emitter 401 provides for substantial invariance of the cross-sectional diameter of the emitted electron beam as the voltage relationship between deflection electrode 403 and electron emitter 401 is invariant. Thus, electron emitter 401, extraction electrode 402, deflection electrode 403, and anode 404 are designed to have a plurality of electrical sources coupled thereto in a manner which provides for a fixed voltage relationship between the deflection electrode and electron emitter and for electrons emitted by the electron emitter and collected by the anode to form an electron beam with a predetermined cross-section.

Figure 4B:
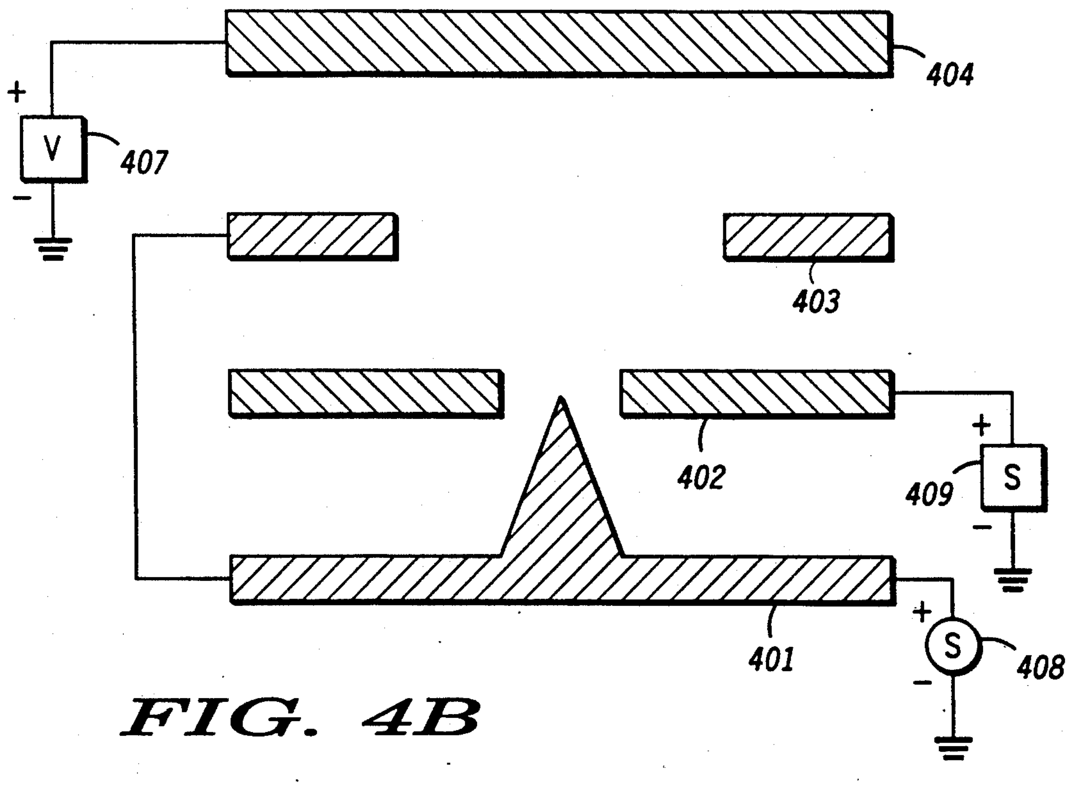

FIG. 4B depicts a different operating embodiment of the FED described previously with reference to FIG. 4A, wherein deflection electrode 403 is coupled to electron emitter 401. In a preferred realization deflection electrode 403 is internally connected to electron emitter 401. In the instances where multiple FEDs are employed in a single electronic device it becomes advantageous to realize the coupling internally to minimize the required interconnections which would be required for externally provided coupling of deflection electrodes to electron emitter electrodes.

In the embodiment of FIG. 4B an externally provided signal source 408, such as for example a voltage source or constant current source, is coupled to electron emitter 401 so as to effect electron emission modulation while an externally provided voltage source 410 is connected to extraction electrode 402 and functions as a device switching voltage to switch the operating state of the FED independent of the voltage on electron emitter 401.

Figure 5A:
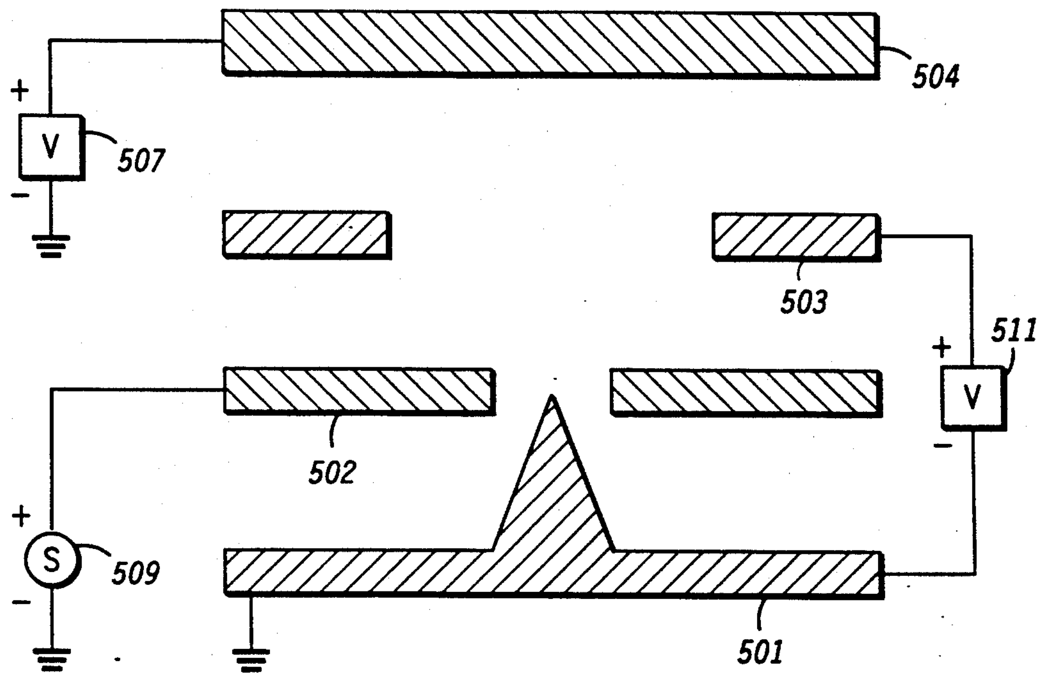
FIGS. 5A and 5B are schematical representations of other methods of operating FEDS in accordance with the present invention.

FIG. 5A is a schematical representation of an embodiment of an FED in accordance with the present invention wherein reference designators corresponding to device features first described with reference to FIG. 2 are similarly referenced beginning with numeral "5". In the embodiment depicted in FIG. 5A an externally provided signal source 509 is coupled to an extraction electrode 502 and provides for modulation of electron emission. An externally provided electrical source 507 is connected to an anode 504 for the preferential collection of the emitted electrons, which electrons are formed into a beam (not shown) of a predetermined cross-section by the cooperation of the various components. An externally provided voltage source 511 is coupled between a deflection electrode 503 and an electron emitter 501 to establish a fixed voltage relationship therebetween. Such a fixed voltage relationship provides for FED operation wherein the desired electron beam cross-section is substantially invariant to variation in extraction electrode voltage which may be employed to provide emitted electron modulation. Again, in this embodiment, the design of electron emitter 501, extraction electrode 502, deflection electrode 503, and anode 504 is such that a plurality of electrical sources are coupled thereto to provide for a fixed voltage relationship between the deflection electrode and electron emitter and for electrons emitted by the electron emitter and collected by the anode to form an electron beam with a predetermined cross-section. Further, as described with reference to FIG. 4A, because the voltage relationship between deflection electrode 503 and electron emitter 501 is invariant the electron beam cross-section is maintained at the predetermined cross-section.

Figure 5B:
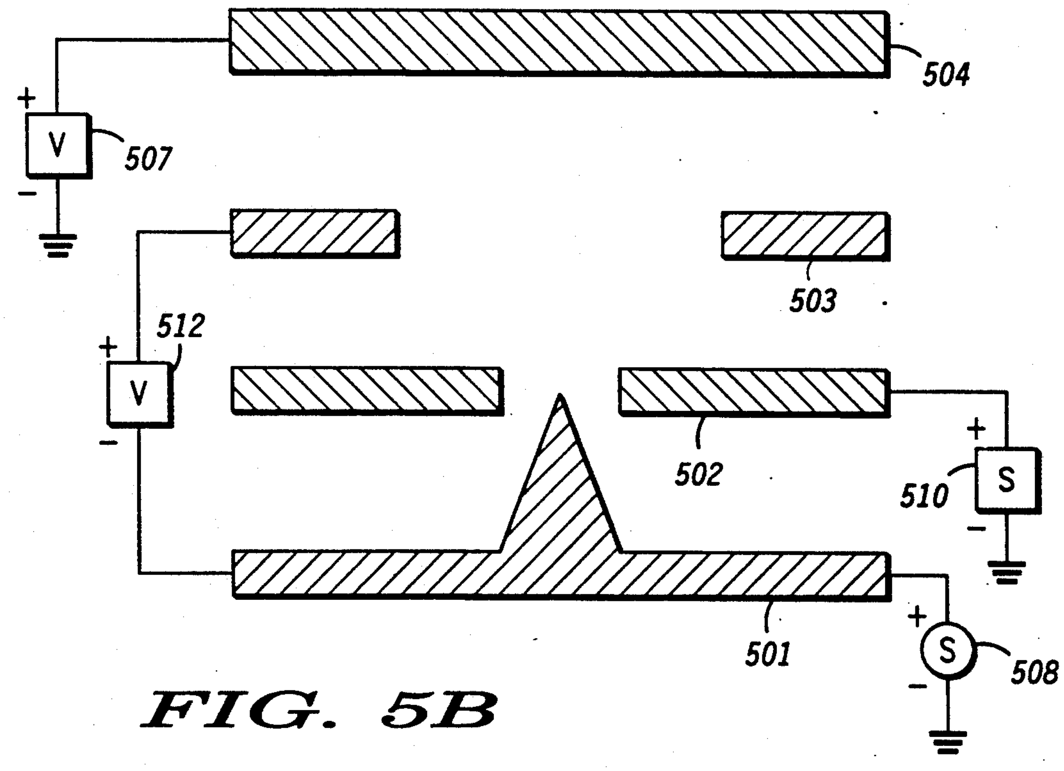

FIG. 5B is a schematical representation of a different operating embodiment of the FED illustrated in FIG. 5A wherein a first externally provided signal source 508 is coupled to electron emitter 501 to effect modulation of the electron emission and a second externally provided voltage source 510 is coupled to extraction electrode 502 to function as a switch to place the FED into the on/off mode independent of electron emitter voltage. Emitted electrons are preferentially collected at anode 504 when a first externally provided voltage source 507 is coupled thereto. In this embodiment a third externally provided voltage source 512 is coupled between deflection electrode 503 and electron emitter 501 so as to provide a fixed voltage relationship therebetween. Such a fixed voltage relationship provides for FED operation wherein the desired electron beam cross-section is substantially invariant to variation in extraction electrode voltage which may be employed to provide emitted electron modulation.

Figure 6C:
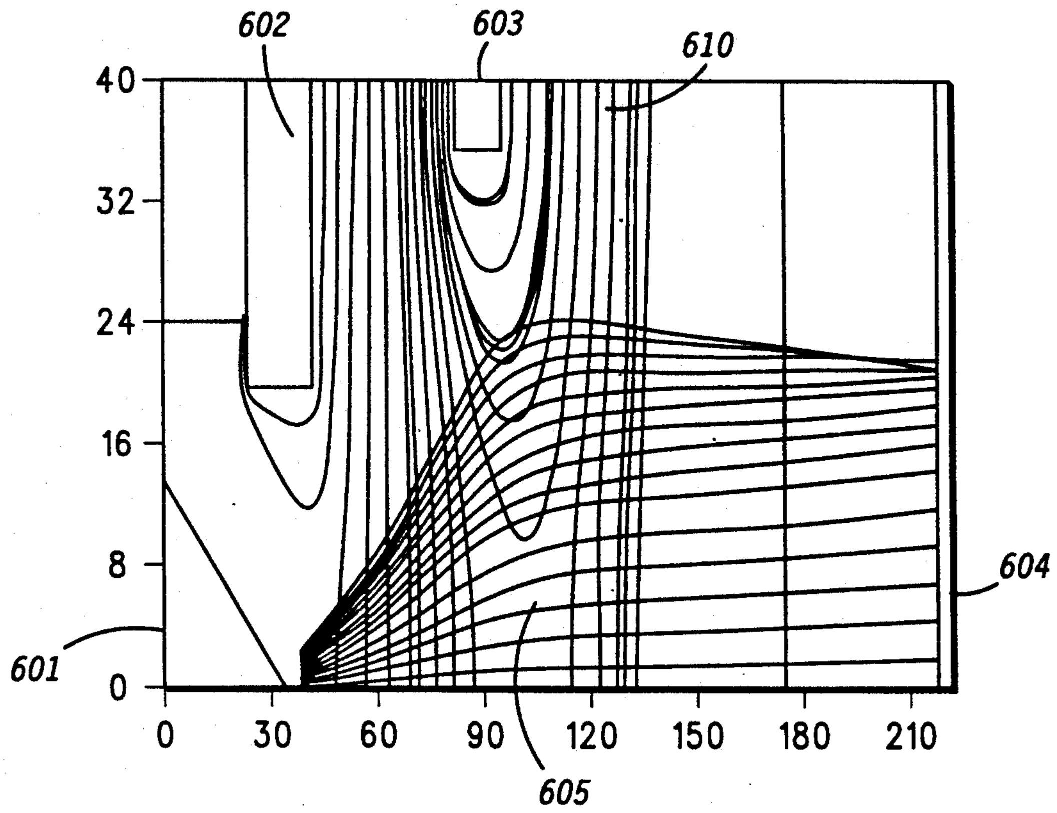
FIGS. 6A–6C are graphical computer model representations of an embodiment of a field emission device and emitted electron trajectories in accordance with the present invention.
Figure 6A:
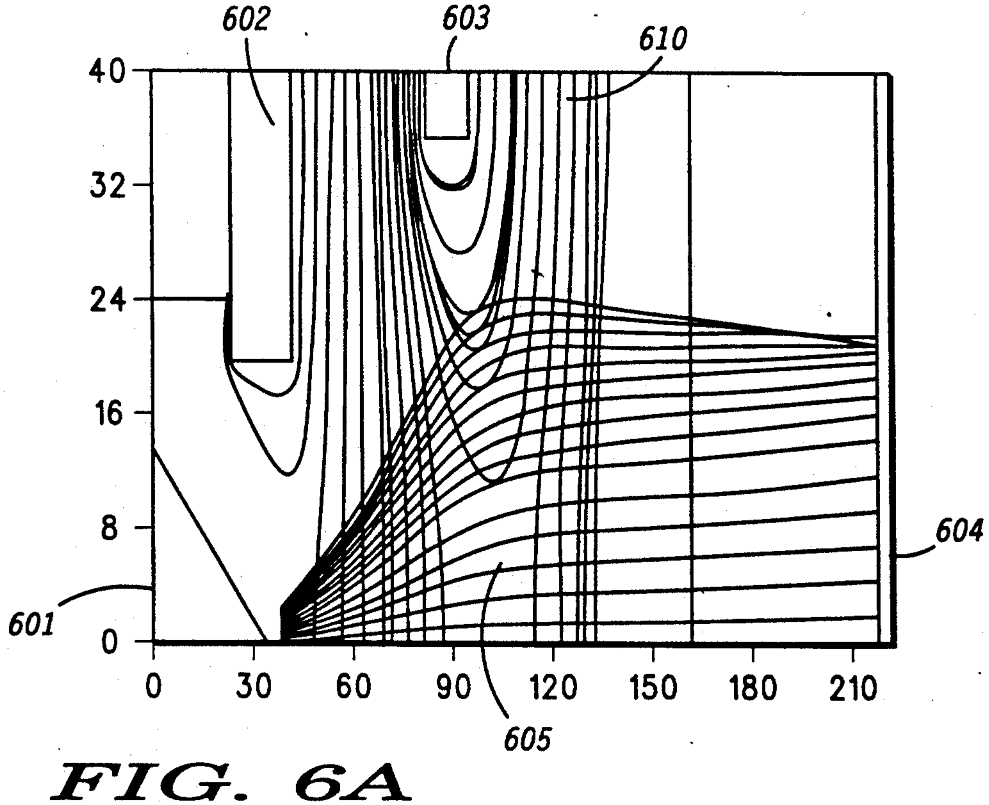

Referring now to FIG. 6A there is depicted a graphical computer model representation of operation of an FED, similar to that described in conjunction with FIG. 3A. However, the FED of FIG. 6A includes structure similar to that described previously with reference to FIGS. 4A–5B and reference designators corresponding to features first described in FIG. 4A are similarly referenced beginning with the numeral "6". The FED of FIG. 6A is operated with applied voltages as described previously with reference to FIG. 3A.

Figure 6B:
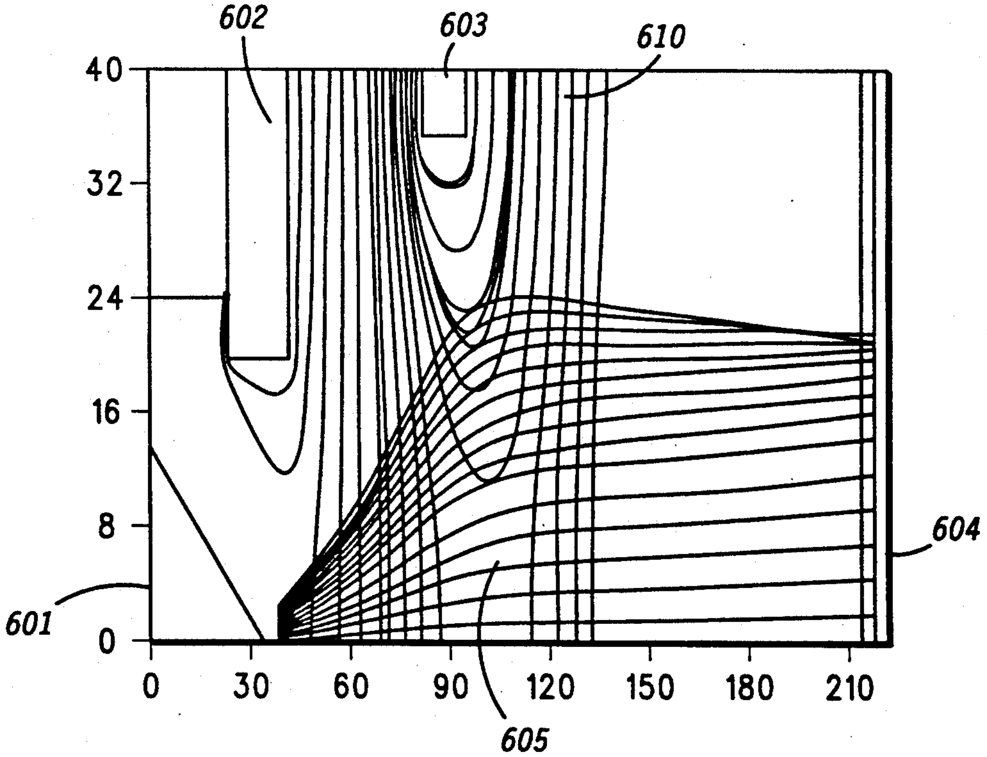

FIG. 6B is a graphical computer model representation of the FED described above with reference to FIG. 6A wherein the externally provided signal source (408, 508 in FIGS. 4B and 5B) coupled to electron emitter 601 is also coupled to deflection electrode 603. In this representation the signal source has been varied such that the voltage has been reduced in a manner corresponding to the variation described previously with reference to FIG. 3B. As can be observed, the cross-section of electron beam 605, corresponding to a predetermined electron beam cross-sectional diameter, remains substantially invariant.

FIG. 6C is a graphical computer model representation of the FED described previously with reference to FIGS. 6A and 6B. In FIG. 6C a voltage variation as described previously with reference to FIG. 3C has been applied to the FED. As can be observed, the cross-section of electron beam 605, corresponding to a predetermined electron beam cross-sectional diameter, remains substantially invariant.

It is an object of the present invention to provide an FED having an integrally formed deflection electrode coupled to the electron emitter in fixed voltage relationship and which employs a plurality of voltage sources coupled to at least some of the electron emitter, the extraction electrode, and the anode, and wherein the desired electron beam cross-section is substantially invariant to variation in electron emitter operating voltage, such as might be encountered during operation wherein electron emission is modulated by variation of the voltage which is coupled to the electron emitter. This objective is realized by coupling the deflection electrode to the electron emitter so that any changes in electron emitter voltage are coincidentally realized at the deflection electrode. By so doing, undesirable variations in electron beam cross-section/cross-sectional diameter are eliminated.

In one embodiment of the present invention an FED with an integrally formed deflection electrode is provided wherein the deflection electrode is operably coupled to the electron emitter so as to provide a substantially identical voltage at the deflection electrode and the electron emitter.

In another embodiment of the present invention the deflection electrode is internally operably coupled to the electron emitter to provide the desired invariance of the electron beam cross-sectional diameter to modulation voltage.

In yet another embodiment an FED circuit includes an FED employing an integrally formed deflection electrode wherein the deflection electrode is operated with a fixed voltage relationship with reference to the electron emitter.

In still another embodiment of the present invention an externally provided fixed value voltage source is coupled between the deflection electrode and electron emitter such that a fixed voltage relationship is established between the deflection electrode and the electron emitter. This fixed voltage relationship is maintained invariant during device operation, during which operation variations in electron emission (modulation) may be effected by varying the voltage of an externally provided signal source.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What we claim is:

1. A field emission device comprising;

an electron emitter for emitting electrons, by field emission, into a region proximal to the electron emitter;

an extraction electrode disposed substantially peripherally symmetrically about at least a part of the electron emitter;

an anode distally disposed with respect to the electron emitter such that some electrons emitted into the region are collected by the anode;

one of the electron emitter and extraction electrode being designed to have an electrical source coupled thereto so as to effect modulation of electron emission into the region; and a deflection electrode disposed in the region substantially symmetrically peripherally about at least a part of and axially displaced with respect to the electron emitter and electrically coupled to the electron emitter, such that the deflection electrode remains at the same potential as the electron emitter.

2. The field emission device of claim 1 wherein the deflection electrode is internally coupled to the electron emitter.

3. A field emission device comprising:

an electron emitter coupled to a reference potential for emitting electrons, by field emission, into a region proximal to the electron emitter;

an extraction electrode disposed substantially peripherally symmetrically about at least a part of the electron emitter;

an anode distally disposed with respect to the electron emitter such that some electrons emitted into the region are collected by the anode;

a voltage source having a first terminal coupled to the anode and a second terminal coupled to the reference potential;

a signal source having a first terminal coupled to the extraction electrode and a second terminal coupled to the reference potential; and a deflection electrode disposed in the region substantially symmetrically peripherally about at least a part of and axially displaced with respect to the electron emitter and electrically coupled to the electron emitter, such that the deflection electrode remains at the same potential as the electron emitter.

4. The field emission device of claim 3 wherein the deflection electrode is internally coupled to the electron emitter.

5. A field emission device comprising:

an electron emitter for emitting electrons, by field emission, into a region proximal thereto;

an extraction electrode disposed substantially peripherally symmetrically about at least a part of the electron emitter;

an anode distally disposed with respect to the electron emitter and having a first voltage source coupled thereto such that some electrons emitted into the region are collected by the anode;

a second voltage source, for switching the device operating state, coupled to the extraction electrode;

a signal source, for modulating electron emission, coupled to the electron emitter; and a deflection electrode disposed in the region substantially symmetrically peripherally about at least a part of and axially displaced with respect to the electron emitter and electrically coupled to the electron emitter such that the deflection electrode remains at the same potential as the electron emitter.

6. The field emission device of claim 5 wherein the deflection electrode is internally coupled to the electron emitter.

7. The field emission device of claim 5 wherein the signal source is a constant current source.

8. A field emission device comprising:

an electron emitter for emitting electrons, by field emission, into a region proximal thereto;

an extraction electrode disposed substantially peripherally symmetrically about at least a part of the electron emitter;

an anode distally disposed with respect to the electron emitter such that some electrons emitted into the region are collected by the anode;

a first voltage source coupled to the anode;

a second voltage source coupled to the extraction electrode for switching the device operating state;

a signal source coupled to the electron emitter for modulating electron emission;

a deflection electrode disposed in the region substantially symmetrically peripherally about at least a part of and axially displaced with respect to the electron emitter; and a third voltage source coupled between the deflection electrode and the electron emitter to provide an offset voltage to the deflection electrode such that the deflection electrode remains at substantially an invariant voltage offset with respect to the electron emitter.

9. The field emission device of claim 8 wherein the deflection electrode is internally operably coupled to the electron emitter.

10. The field emission device of claim 8 wherein the signal source is a constant current source.

11. A field emission device circuit comprising:

a field emission device having at least an electron emitter for emitting electrons by field emission, an extraction electrode for inducing the electron field emission from the electron emitter, a defection electrode for modifying emitted electron trajectories, and an anode for collecting emitted electrons, electrons emitted by the electron emitter and collected by the anode forming an electron beam with a predetermined cross-section;

a plurality of electrical sources coupled to the electron emitter, extraction electrode, deflection electrode, and anode in a manner which provides for a fixed voltage relationship between the deflection electrode and electron emitter; and a signal source coupled to one of the electron emitter and extraction electrode for modulating electron emission in the field emission device, such that variation of the signal source to effect modulation of the electron emission does not substantially change the electron beam cross-section.

12. The field emission device circuit of claim 11 wherein the deflection electrode is operably internally coupled to the electron emitter electrode.

13. The field emission device circuit of claim 11 wherein the signal source is a constant current source.

14. A field emission device circuit comprising a field emission device having an electron emitter for emitting electrons by field emission, an extraction electrode for inducing the electron field emission from the electron emitter, a deflection electrode for modifying emitted electron trajectories, and an anode for collecting emitted electrons, the electron emitter, extraction electrode, deflection electrode, and anode being designed to have a plurality of electrical sources coupled thereto in a manner which provides for a fixed voltage relationship between the deflection electrode and electron emitter and for electrons emitted by the electron emitter and collected by the anode to form an electron beam with a predetermined cross-section.

15. The field emission device circuit of claim 14 wherein one of the electron emitter and extraction electrode are designed to have a signal source coupled thereto for modulating electron emission in the field emission device, such that variation of the signal source to effect modulation of the electron emission does not substantially change the electron beam cross-section.

* * * * *